US011336272B2

United States Patent
Venugopal et al.

(10) Patent No.: US 11,336,272 B2
(45) Date of Patent: May 17, 2022

(54) LOW POWER SINGLE RETENTION PIN FLIP-FLOP WITH BALLOON LATCH

(71) Applicant: Apple Inc., Cupertino, CA (US)

(72) Inventors: Vivekanandan Venugopal, San Jose, CA (US); Qi Ye, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/028,790

(22) Filed: Sep. 22, 2020

(65) Prior Publication Data
US 2022/0094340 A1    Mar. 24, 2022

(51) Int. Cl.
*H03K 3/012* (2006.01)
*H03K 3/356* (2006.01)
*H03K 3/037* (2006.01)
*H03K 3/0233* (2006.01)

(52) U.S. Cl.
CPC ....... *H03K 3/356008* (2013.01); *H03K 3/012* (2013.01); *H03K 3/02335* (2013.01); *H03K 3/037* (2013.01); *H03K 3/0375* (2013.01)

(58) Field of Classification Search
CPC .. H03K 3/012; H03K 3/02335; H03K 3/0375; H03K 3/356008
See application file for complete search history.

(56) References Cited

U.S. PATENT DOCUMENTS

| | | | |
|---|---|---|---|
| 7,548,103 B2 | 6/2009 | Ramaraju et al. | |
| 8,760,193 B2 | 6/2014 | Voogel et al. | |
| 8,786,344 B2 | 7/2014 | Salling | |
| 9,071,233 B2 | 6/2015 | Elkin et al. | |
| 10,734,978 B2 * | 8/2020 | Purushothaman | ..... H03K 3/012 |
| 10,742,201 B2 | 8/2020 | Venugopal et al. | |
| 2004/0041610 A1 | 3/2004 | Kundu | |
| 2006/0055653 A1 | 3/2006 | Matsumoto et al. | |
| 2007/0230266 A1 | 10/2007 | Kao | |
| 2017/0288670 A1 | 10/2017 | Kozuma et al. | |

* cited by examiner

*Primary Examiner* — Patrick O Neill
(74) *Attorney, Agent, or Firm* — Kowert Hood Munyon Rankin and Goetzel PC; Rory D. Rankin

(57) ABSTRACT

Systems, apparatuses, and methods for implementing a low-power, single-pin retention flip-flop with a balloon latch are described. A flip-flop is connected to a retention latch to store a value of the flip-flop during a reduced power state. A single retention pin is used to turn on the retention latch. During normal mode, the retention latch is pre-charged and a change in the value stored by the flip-flop does not cause the retention latch to toggle. This helps to reduce the power consumed by the circuit during normal mode (i.e., non-retention mode). When the retention signal becomes active, the retention latch gets triggered and the value stored by the flip-flop is written into the retention latch. Later, if the flip-flop is powered down and then powered back up while the circuit is in retention mode, the value in the retention latch gets written back into the flip-flop.

20 Claims, 7 Drawing Sheets

LOW POWER SINGLE RETENTION PIN FLIP-FLOP WITH BALLOON LATCH

TECHNICAL FIELD

Embodiments described herein relate to the field of circuits and, more particularly, to efficiently retaining data in sequential elements during power down modes.

DESCRIPTION OF THE RELATED ART

Digital electronic systems utilize a number of different types of synchronous circuits for controlling the movement of information. Sequential elements are used for storing and driving data in a variety of circuits such as general-purpose central processing units (CPUs), data parallel processors like graphics processing units (GPUs), digital signal processors (DSPs), and so forth. Modern processors are typically pipelined. For example, the processors include one or more data processing stages connected in series with sequential elements placed between the stages for storing and driving the data. The output of one stage is made the input of the next stage during each transition of a clock signal. The sequential elements typically are flip-flop circuits.

A flip-flop circuit includes one or more data inputs, a clock input, and one or more data outputs. Logic signals may be received on the data input(s) of a flip-flop circuit. Responsive to an edge (e.g., a rising edge) of the clock signal, the logic values of these signals may be captured and stored in the flip-flop circuit, with these values being stored until another synchronizing edge (e.g., the next rising edge) is received. Between these edges, the flip-flop circuit stores the captured logic value. During power down modes, the power supply voltage is reduced to a ground reference voltage level to reduce power consumption. However, when sequential elements are powered off, the stored data is not retained.

SUMMARY

Systems, apparatuses, and methods for implementing a low-power, single retention pin flip-flop with a balloon latch are contemplated. In one embodiment, a flip-flop is connected to a retention latch to store a value of the flip-flop when the flip-flop goes into a reduced power state. When the retention latch is disabled, the retention latch does not toggle as the flip-flop value toggles. This helps to reduce the power consumed by the circuit during normal mode (i.e., non-retention mode). In one embodiment, a single retention pin is used to turn on the retention latch. When the retention signal from the single retention pin is activated, the retention latch is turned on and the data value stored in the flip-flop is copied into the retention latch. Later, if the flip-flop is powered down and then powered back up while the circuit is in retention mode, the data value stored by the retention latch is written back to the flip-flop.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
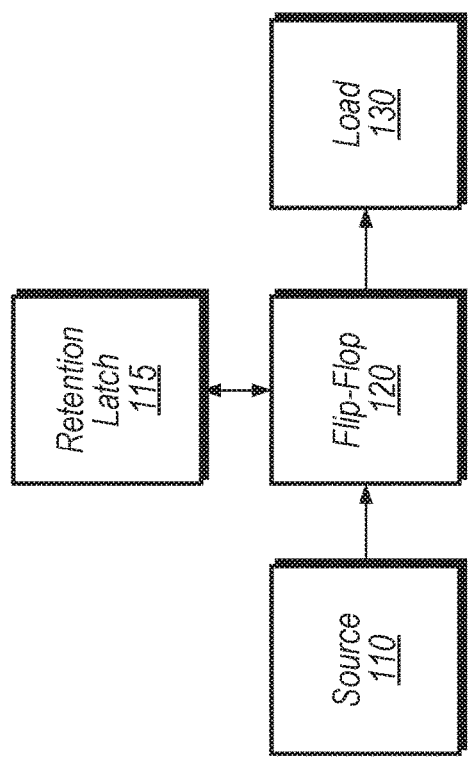
FIG. 1 is a generalized block diagram of one embodiment of an integrated circuit.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram of one embodiment of an integrated circuit (IC) 100 is shown. In one embodiment, IC 100 includes source 110, retention latch 115, flip-flop 120, and load 130. It should be understood that IC 100 may also include any number of other components (e.g., voltage regulator, memory devices, processing elements) which are not shown to avoid obscuring the figure. Also, although only a single instance of source 110, retention latch 115, flip-flop 120, and load 130 are shown in FIG. 1, it should be understood that IC 100 may include multiple instances of source 110, retention latch 115, flip-flop 120, and/or load 130.

Source 110 is representative of any type of circuit element or logic gate that generates one or more signals which are connected to flip-flop 120. Flip-flop 120 is connected to retention latch 115 to allow the value of flip-flop 120 to be retained when flip-flop 120 enters a reduced power state. It is noted that a "retention latch" may also be referred to as a "balloon latch". For a flip-flop to go into retention, typically two retention signals are utilized. These retention signals are costly because they are always-on signals. These retention signals are also routed throughout the IC, which makes routing more difficult. However, rather than using two retention signals, retention latch 115 has a single retention pin for controlling when the value from flip-flop 120 is copied to retention latch 115. More details regarding implementations of a single-retention pin retention latch 115 and flip-flop 120 will be presented throughout the remainder of this specification. Load 130 is representative of any number and type of circuit elements, logic gates, and/or flip-flops for receiving the output of flip-flop 120.

Figure 2:
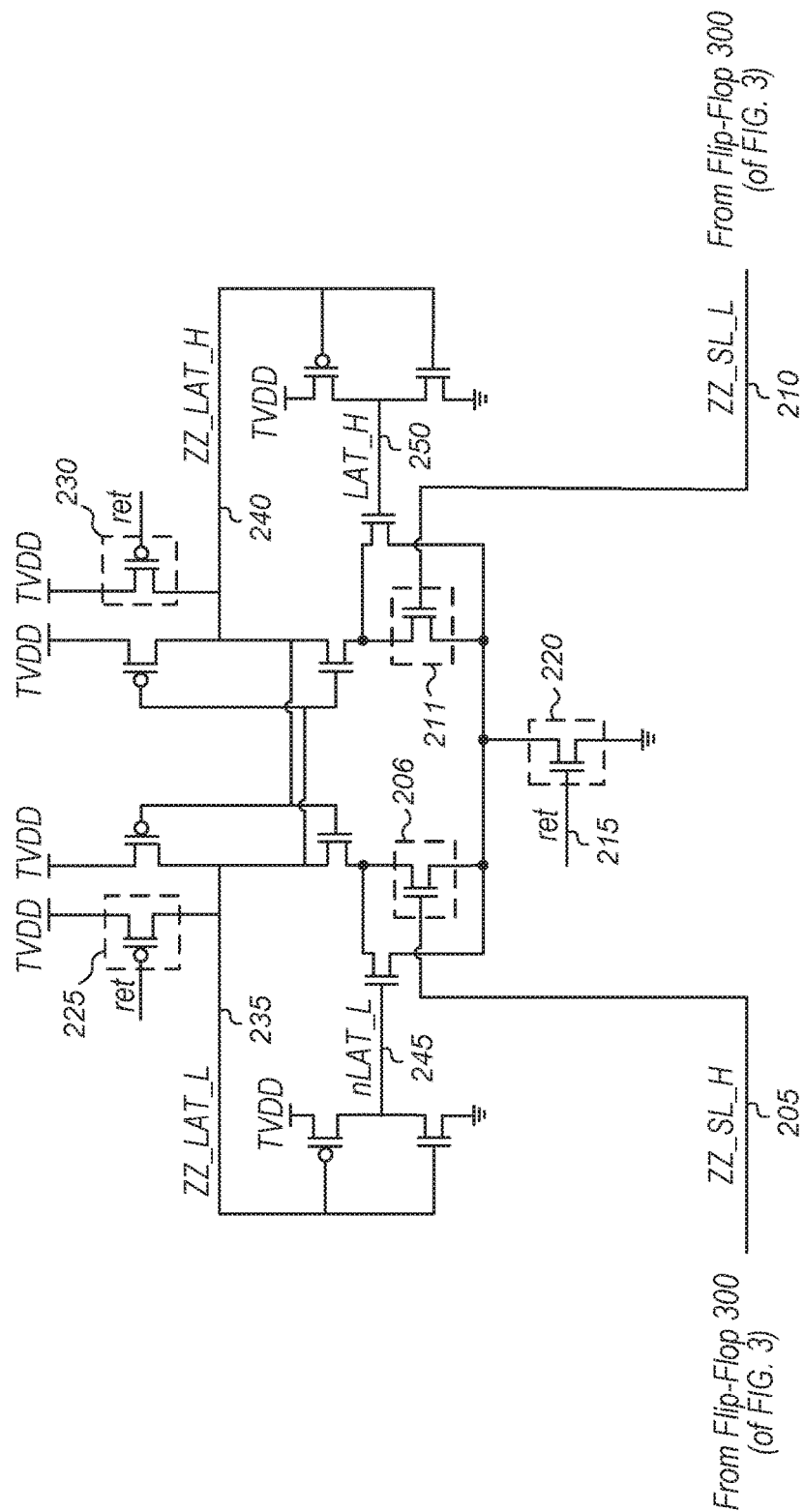
FIG. 2 is a circuit diagram illustrating one embodiment of a retention latch with a single retention pin.

Turning now to FIG. 2, a circuit diagram of one embodiment of a retention latch 200 with a single retention pin 215 is shown. In one embodiment, the circuitry of retention latch 200 is included within retention latch 115 (of FIG. 1). As shown in FIG. 2, a retention signal from a single retention pin 215 is coupled to the gates of N-type transistor 220 and P-type transistors 225 and 230. When the retention signal 215 is at a logic low level (i.e., with a voltage equal to 0 Volts or ground), P-type transistors 225 and 230 are conducting, causing nodes 235 and 240 to be pre-charged. When retention signal 215 transitions to a logic high level (i.e., with a voltage equal to TVDD), P-type transistors 225 and 230 are turned off, which terminates the pre-charging phase. Also, when the retention signal 215 transitions to the logic high level, N-type transistor 220 starts to conduct. This causes the N-type transistors 206 and 211 to be activated and to copy the data value from signals 205 and 210 into nodes 245 and 250. Later, when the retention signal 215 transitions back to a logic low level (i.e., with a voltage equal to ground), retention latch 200 goes back into the pre-charging phase.

When retention signal 215 is at the logic high level (i.e., when retention latch 200 is in retention mode), retention latch 200 maintains the captured data from the secondary latch while also continuously writing the data to the secondary latch. When the main flop is powered down, the data of the main flop is lost. Once the main flop is powered up, retention latch 200 will start driving the captured data into the secondary latch. When retention signal 215 transitions back to a logic low level, retention latch 200 goes into a pre-charge phase. With a single retention signal 215, when retention latch 200 is in retention mode and the secondary latch is powered on, data from retention latch 200 is driven to the secondary latch although the secondary latch is not enabled as transmission gate 325 (of FIG. 3) is off. When retention latch 200 is in retention mode and the secondary latch is powered on, all of the nodes in the secondary latch are stable with values reflecting those of the retention latch 200 values. Once retention mode is disabled (i.e., when retention signal 215 transitions to the logic low level), the secondary latch becomes enabled, and the value that was present in retention latch 200 prior to exiting retention mode is maintained by the secondary latch.

In one embodiment, the signal 205 is provided by the secondary latch of a flip-flop (e.g., flip-flop 300 (of FIG. 3)) and coupled to the gate of N-type transistor 206. Signal 205 is labeled as "ZZ_SL_H" in FIG. 2. Also, the signal 210 is provided by the secondary latch of the flip-flop and coupled to the gate of N-type transistor 211. Signal 210 is labeled as "ZZ_SL_L" in FIG. 2. The drain of P-type transistor 225 is labeled as the signal "ZZ_LAT_L" and as node 235. Also, the drain of P-type transistor 230 is labeled as the signal "ZZ_LAT_H" and as node 240. Node 245, labeled as "nLAT_L", is connected to flip-flop 300 (of FIG. 3), while node 240, labeled as "ZZ_LAT_H", is also connected to flip-flop 300.

It is noted that, in various embodiments, a "transistor" can correspond to one or more transconductance elements such as a metal-oxide-semiconductor field-effect transistor (MOSFET), a junction field-effect transistor (JFET), a bipolar transistor, or others. For example, in one embodiment, each P-type transistor is a P-type metal-oxide-semiconductor field-effect transistor (MOSFET) and each N-type transistor is an N-type MOSFET. In other embodiments, the P-type transistors and N-type transistors shown in the circuits herein can be implemented using other types of transistors. It is also noted that the terms N-type and P-type can be used interchangeably with N-channel and P-channel, respectively. Although single devices are depicted in the circuit diagrams of this disclosure, in other embodiments, multiple devices may be used in parallel to form any of the above devices.

It is noted that the supply voltage for the various P-type transistors of retention latch 200 is labeled as "TVDD" which represents True VDD. This is to differentiate from the supply voltage provided to the transistors of flip-flop 300 which is labeled as "VDD". The supply voltage "TVDD" represents the retention supply voltage or the always-on voltage. The supply voltage "VDD" represents a controllable power supply that can be switched off during a reduced power mode. It should be understood that retention latch 200 is merely one possible implementation of a retention latch with a single retention pin. Other structures of a retention latch with a single retention pin may be implemented with other components, connections, and layouts are possible and are contemplated.

Figure 3:
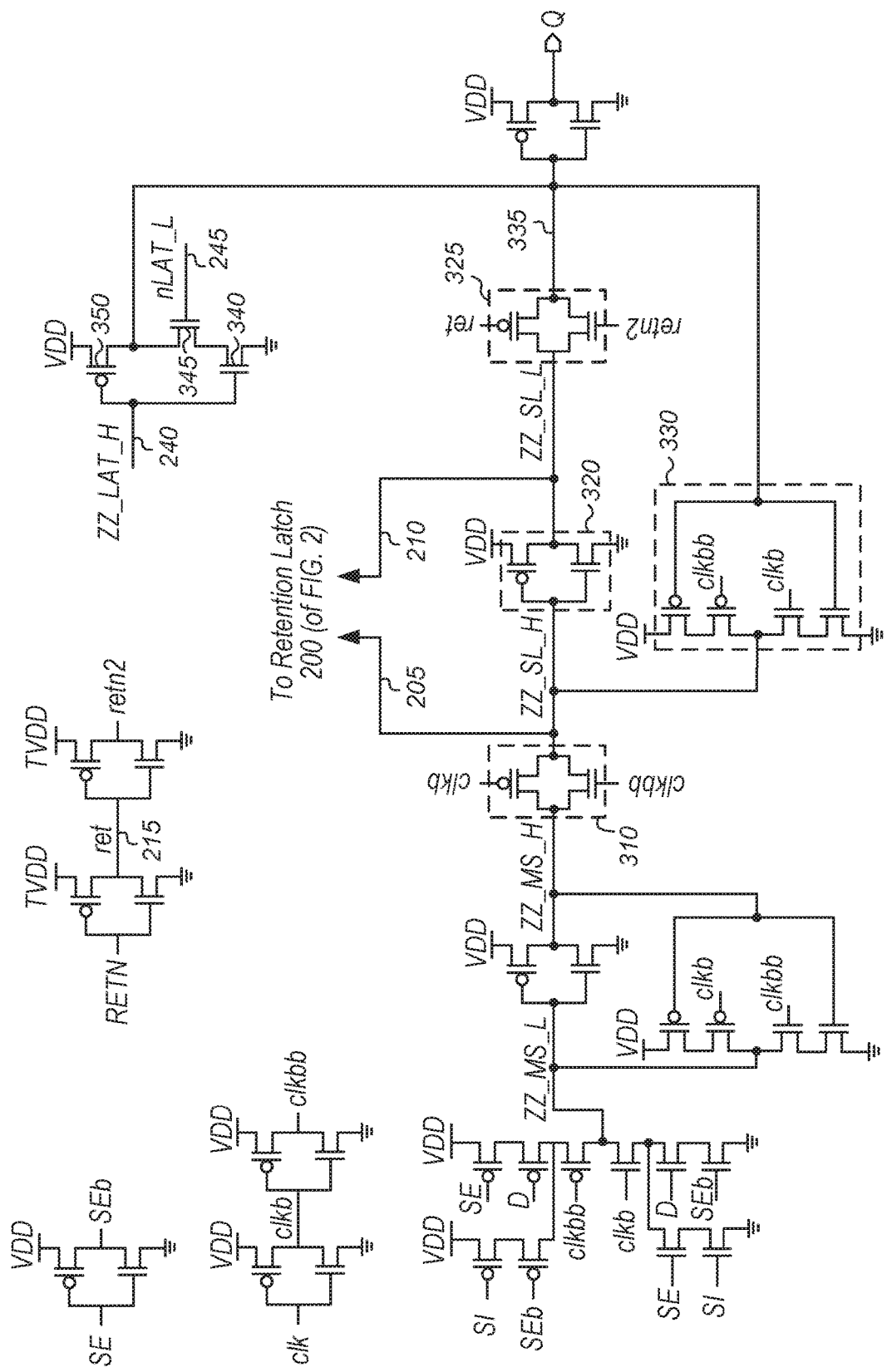
FIG. 3 is a circuit diagram of one embodiment of a flip-flop.

Referring now to FIG. 3, a circuit diagram of one embodiment of a flip-flop 300 is shown. In one embodiment, the circuitry of flip-flop 300 is included within flip-flop 120 (of FIG. 1). Also, it is noted that signals 205, 210, 215 (or "ret"), 240 (or "ZZ_LAT_H"), and 245 (or "nLAT_L") are common between retention latch 200 (of FIG. 2) and flip-flop 300. In one embodiment, flip-flop 300 includes the scan-enable and scan-input signals shown on the left-side of FIG. 3. The input signal (or "D") is also received and shown on the left-side of FIG. 3 as an input to the gates of two transistors coupled to the primary latch portion of flip-flop 300. The primary latch portion of flip-flop 300 includes the nodes labeled "ZZ_MS_L" and "ZZ_MS_H". The secondary latch portion of flip-flop 300 includes the nodes labeled "ZZ_SL_H" and "ZZ_SL_L". The secondary latch nodes 205 "ZZ_SL_H" and 210 "ZZ_SL_L" are coupled to the retention latch 200 to allow the state of the nodes 205 and 210 of the secondary latch to be written to retention latch 200 when retention latch 200 is in retention mode. Also, the state of retention latch 200 is continuously written back to the nodes 205 and 210 of the secondary latch when retention latch 200 is in retention mode.

It is noted that flip-flop 300 and retention latch 200 are able to operate using a single retention pin "ret" labeled as signal 215. In one embodiment, an active-low input retention signal "RETN" is inverted to create the signal "ret", and then another inversion is performed to create the signal "retn2" as shown at the top of FIG. 3. Also, in one embodiment, the input clock signal "clk" is inverted once to create the inverted clock signal "clkb" and then inverted again to create the double-inverted clock signal "clkbb". These clock signals are coupled to the various transistors and transmission gates shown within the flip-flop 300.

During normal operation, the value from the D-input is latched into the primary latch portion of flip-flop 300 and then into the secondary latch portion via transmission gate 310. As the value of nodes 205 and 210 toggle, these values do not cause the values of nodes 245 and 250 of retention latch 200 to toggle while flip-flop 300 is in normal mode. This helps to reduce the power consumed by retention latch 200. Later, when flip-flop 300 goes into retention mode, the "ret" signal 215 will transition to a logic high level. This will cause the value on nodes 205 and 210 of the secondary latch to be written to nodes 245 and 250 of retention latch 200 (of FIG. 2). Flip-flop 300 can then be powered down since the data is now preserved in retention latch 200. It is noted that during power-down, VDD will be turned off (or reduced in voltage) while TVDD remains at its normal voltage level. To exit retention mode, the "ret" signal is transitioned back to a logic low level, and retention latch 200 goes back into the pre-charging phase.

Pre-buffered data output 335 is coupled to the drain of a first P-type transistor (e.g., P-type transistor 350) and to the drain of a first N-type transistor (e.g., N-type transistor 345), shown at the top right of FIG. 3. The signal "nLAT_L" is coupled to the gate of the first N-type transistor, while the signal "ZZ_LAT_H" is coupled to the gates of the first P-type transistor and a second N-type transistor (e.g., N-type transistor 340). The drain of the second N-type transistor is coupled to the drain of the first N-type transistor. Signal "ZZ_LAT_H" is also referred to as signal or node 240, while signal "nLAT_L" is also referred to as signal or node 245.

Figure 4:
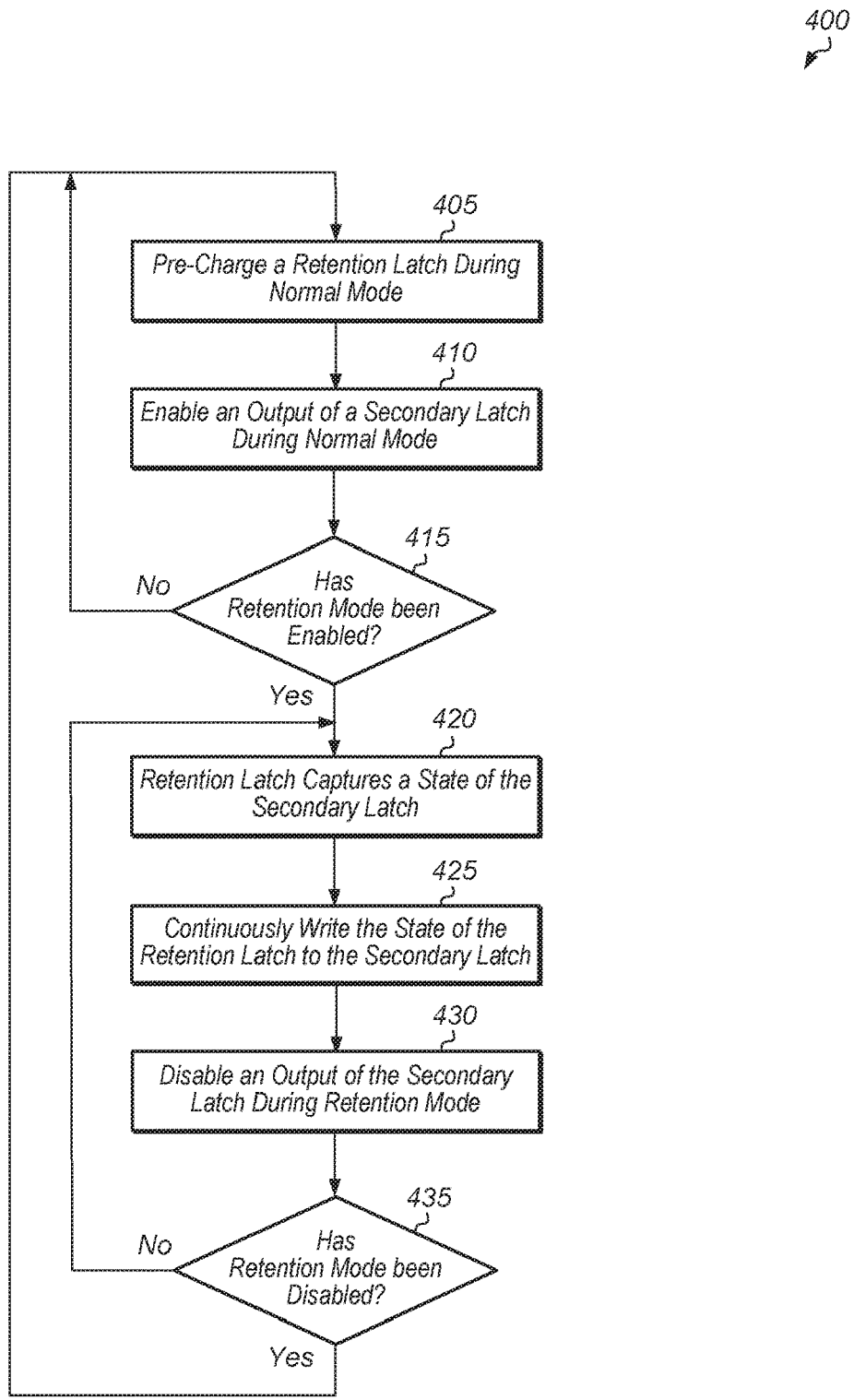
FIG. 4 is a flow diagram of one embodiment of a method for operating a retention latch.

Turning now to FIG. 4, one embodiment of a method 400 for operating a retention latch is shown. For purposes of discussion, the steps in this embodiment (and of FIGS. 5-6) are shown in sequential order. However, in other embodiments some steps may occur in a different order than shown, some steps may be performed concurrently, some steps may be combined with other steps, and some steps may be absent.

A retention latch is pre-charged while the retention latch is in normal mode (i.e., while the retention latch is not enabled) (block 405). An output of a secondary latch is enabled during normal mode (block 410). During normal mode, the retention latch does not toggle as the secondary latch toggles. Rather, the retention latch is in a pre-charge state during normal mode. If retention mode has been enabled (conditional block 415, "yes" leg), then a state of the secondary latch is captured by the retention latch (block 420). Otherwise, if the retention latch remains in normal mode (conditional block 415, "no" leg), then method 400 returns to block 405.

After block 420, the retention latch continuously writes the state of the retention latch to the secondary latch (block 425). Also, an output of the secondary latch is disabled in retention mode (block 430). If retention mode has been disabled (conditional block 435, "yes" leg), then method 400 returns to block 405. If the retention latch remains in retention mode (conditional block 430, "no" leg), then method 400 returns to block 420.

Figure 5:
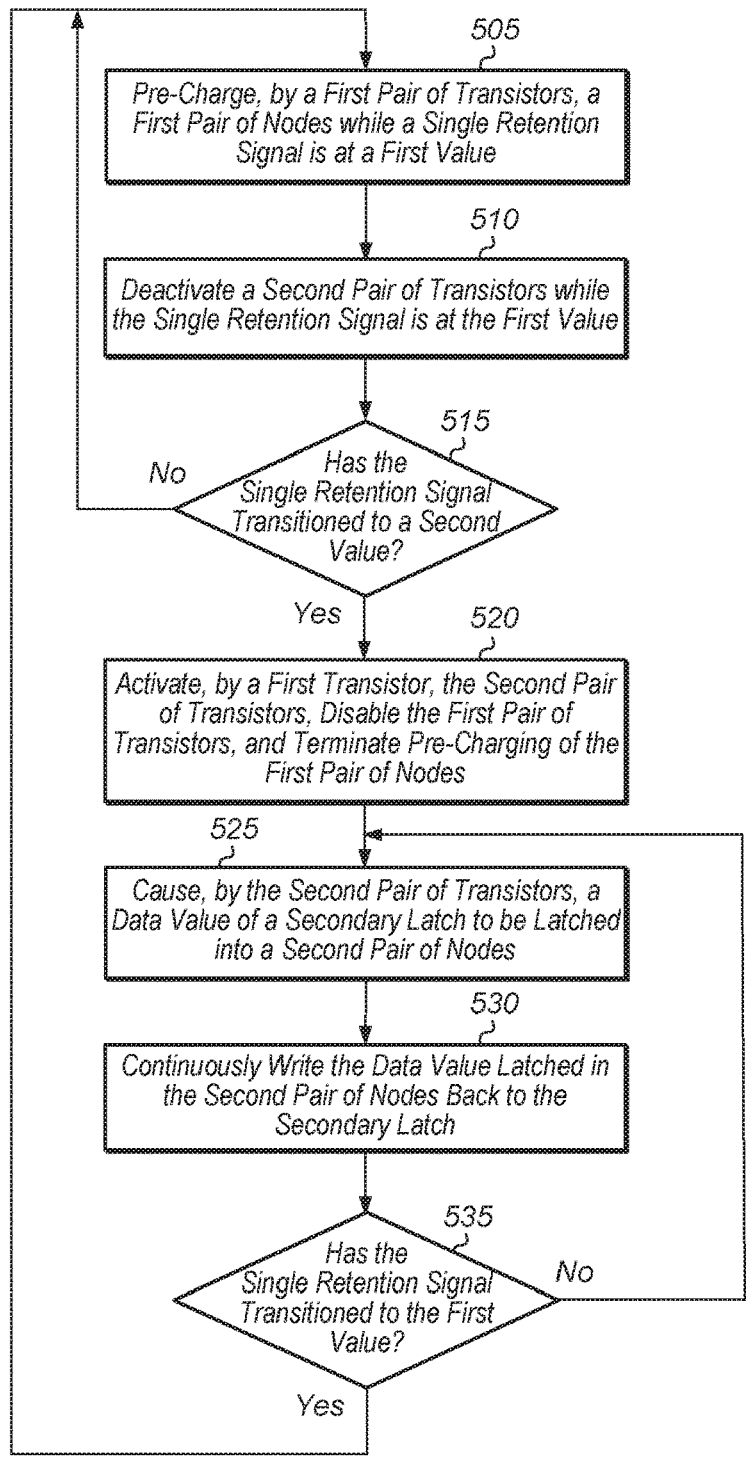
FIG. 5 is a flow diagram of one embodiment of a method for implementing a single-pin retention latch.

Referring now to FIG. 5, one embodiment of a method 500 for using a single retention pin to enter and exit retention mode is shown. A first pair of nodes (e.g., nodes 235 and 240 of FIG. 2) are pre-charged by a first pair of transistors (e.g., P-type transistors 225 and 230 of FIG. 2) while a single retention signal is at a first value (block 505). In one embodiment, the first value is "0" or ground. Also, a second pair of transistors (e.g., N-type transistors 206 and 211 of FIG. 2) are deactivated (i.e., prevented from conducting) while the single retention signal is at the first value (block 510). If the single retention signal transitions to a second value (conditional block 515, "yes" leg), a first transistor (e.g., N-type transistor 220) activates the second pair of transistors, the first pair of transistors are disabled, and the pre-charging of the first pair of nodes terminates (block 520). In one embodiment, the second value is "1" or TVDD. If the retention signal remains at the first value (conditional block 515, "no" leg), then method 500 returns to block 505.

In response to the first transistor being activated, the second pair of transistors cause a data value of a secondary latch to be latched into a second pair of nodes (e.g., nodes 245 and 250 of FIG. 2) (block 525). Also, the data value latched in the second pair of nodes is continuously written back to the secondary latch (block 530). If the single retention signal transitions back to the first value (conditional block 535, "yes" leg), then method 500 returns to block 505. Otherwise, if the retention signal remains at the second value (conditional block 535, "no" leg), then method 500 returns to block 525.

Figure 6:
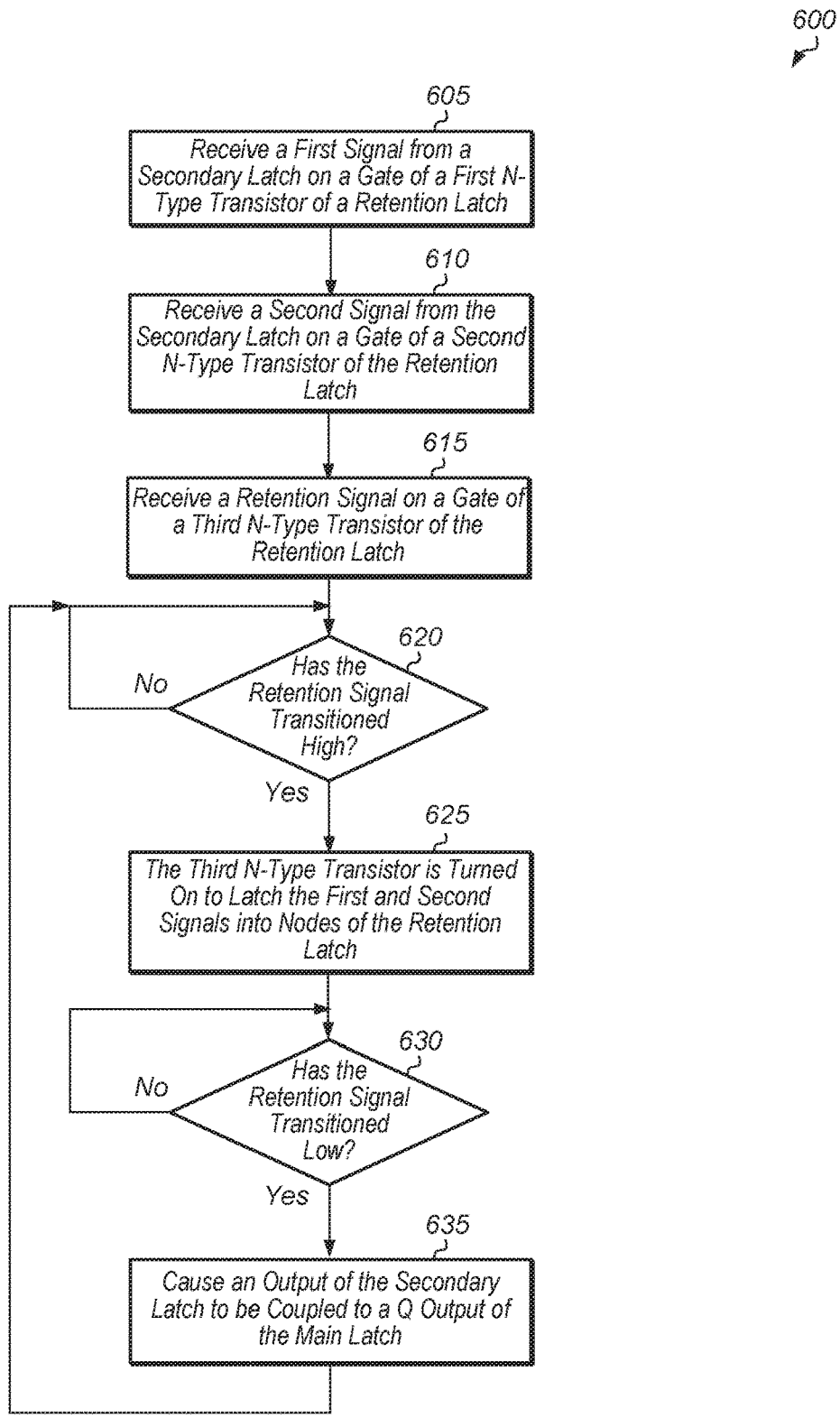
FIG. 6 is a flow diagram of one embodiment of a method for transitioning in and out of retention mode.

Turning now to FIG. 6, one embodiment of a method 600 for transitioning in and out of retention mode is shown. A first signal from a secondary latch is received on a gate of a first N-type transistor (e.g., N-type transistor 206 of FIG. 2) of a retention latch (block 605). Also, a second signal from the secondary latch is received on a gate of a second N-type transistor (e.g., N-type transistor 211 of FIG. 2) of the retention latch (block 610). A retention signal is received by a gate of a third N-type transistor (e.g., N-type transistor 215 of FIG. 2) of the retention latch (block 615). It is assumed for the purposes of this discussion that the retention signal starts out at a logic low level.

If the retention signal transitions to a logic high level (i.e., 1) (conditional block 620, "yes" leg), then the third N-type transistor is turned on and the first and second signals are latched into nodes (e.g., nodes 245 and 250 of FIG. 2) of the retention latch (block 625). Later, if the retention signal transitions to a logic low level (conditional block 630, "yes" leg), then a transmission gate (e.g., transmission gate 325) is activated causing an output of the secondary latch to be coupled to the Q output of the main latch (block 635). After block 635, method 600 returns to conditional block 620.

Figure 7:
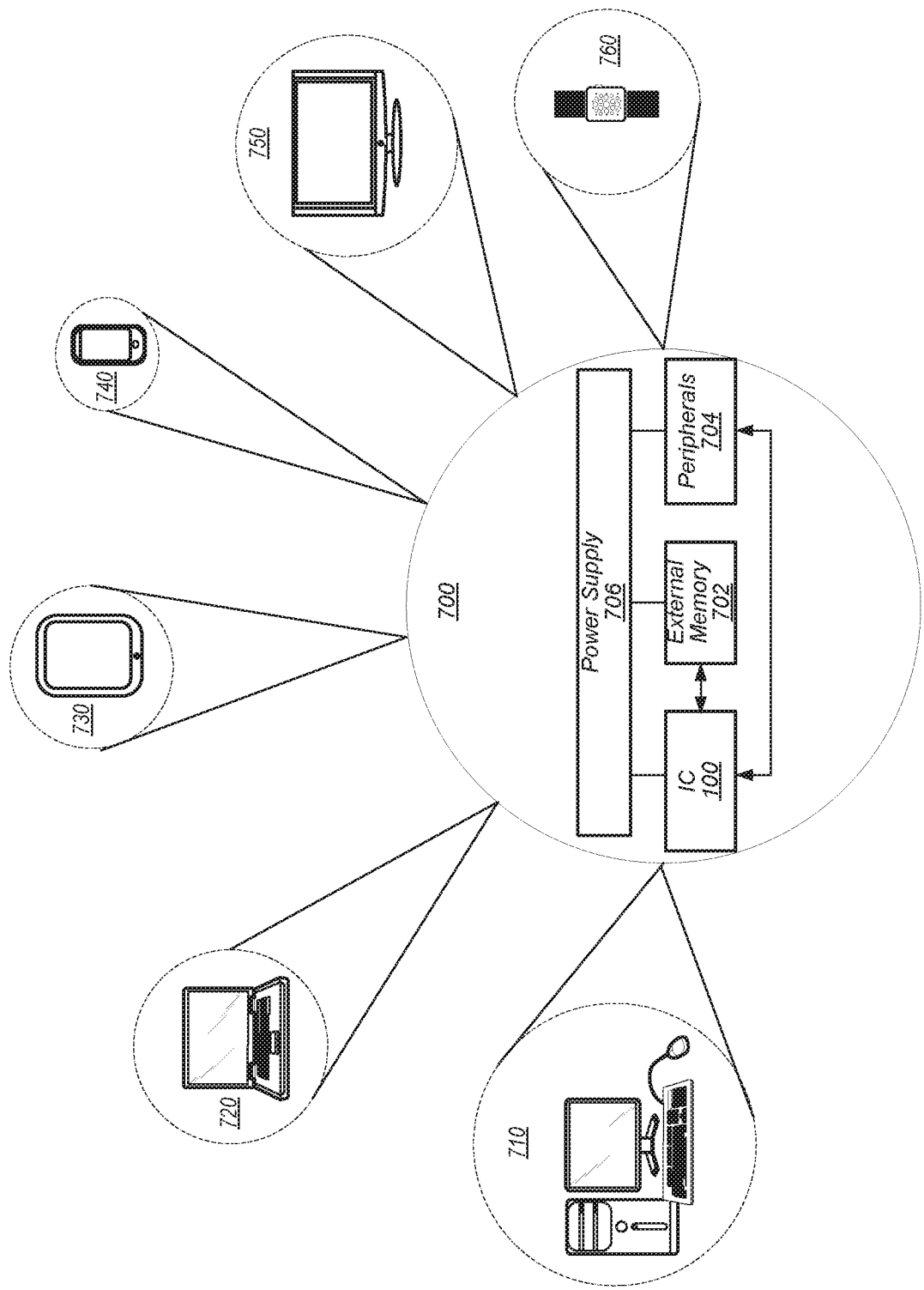
FIG. 7 is a block diagram of one embodiment of a system.

Referring now to FIG. 7, a block diagram of one embodiment of a system 700 is shown. As shown, system 700 may represent chip, circuitry, components, etc., of a desktop computer 710, laptop computer 720, tablet computer 730, cell or mobile phone 740, television 750 (or set top box configured to be coupled to a television), wrist watch or other wearable item 760, or otherwise. Other devices are possible and are contemplated. In the illustrated embodiment, the system 700 includes at least one instance of integrated circuit (IC) 100 (of FIG. 1) coupled to one or more peripherals 704 and the external memory 702. A power supply 706 is also provided which supplies the supply voltages to IC 100 as well as one or more supply voltages to the memory 702 and/or the peripherals 704. In various embodiments, power supply 706 may represent a battery (e.g., a rechargeable battery in a smart phone, laptop or tablet computer). In some embodiments, more than one instance of IC 100 may be included (and more than one external memory 702 may be included as well).

The memory 702 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 704 may include any desired circuitry, depending on the type of system 700. For example, in one embodiment, peripherals 704 may include devices for various types of wireless communication, such as wifi, Bluetooth, cellular, global positioning system, etc. The peripherals 704 may also include additional storage, including RAM storage, solid state storage, or disk storage. The peripherals 704 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A flip-flop circuit comprising:
   a primary latch configured to latch a data value present on an input port responsive to detecting a synchronizing edge of a clock signal;
   a secondary latch coupled to the primary latch, wherein the secondary latch is configured to latch the data value stored by the primary latch; and
   a retention latch coupled to the secondary latch, wherein the retention latch is configured to:
      remain in a pre-charge state when a single retention mode pin is a first value; and
      receive and store the data value of the secondary latch when the single retention mode pin transitions from the first value to a second value;
   wherein the data value stored by the primary latch is unaffected by a value of the single retention mode pin and a logic level of the clock signal following the synchronizing edge.

2. The flip-flop circuit as recited in claim 1, wherein the retention latch is configured to continuously write a data value back to the secondary latch when the single retention mode pin is the second value, and wherein an output of the secondary latch is disabled when the single retention mode pin is the second value.

3. The flip-flop circuit as recited in claim 1, wherein when the retention latch is in the pre-charge state, the retention latch does not respond to changes in the data value stored by the secondary latch.

4. The flip-flop circuit as recited in claim 1, wherein a first input received by the retention latch from the secondary latch is coupled to a gate of a first N-type transistor, and wherein a second input received by the retention latch from the secondary latch is coupled to a gate of a second N-type transistor.

5. The flip-flop circuit as recited in claim 4, wherein a node of the retention latch is coupled to a gate of a third N-type transistor of the secondary latch.

6. The flip-flop circuit as recited in claim 5, wherein a drain of the third N-type transistor is coupled to a pre-buffered data output of the flip-flop circuit.

7. The flip-flop circuit as recited in claim 6, wherein a signal from the single retention mode pin is coupled to a gate of a fourth N-type transistor, wherein the fourth N-type transistor activates the first and second N-type transistors when the signal from the single retention mode pin is the first value.

8. A method comprising:
   receiving, by a primary latch, a data value present on an input port responsive to detecting a synchronizing edge of a clock signal;
   latching, by a secondary latch, the data value stored by the primary latch; and
   receiving, by a retention latch, a value from the secondary latch, the retention latch:
      remaining in a pre-charge state when a single retention mode pin is a first value; and receiving and storing the data value of the secondary latch when the single retention mode pin transitions from the first value to a second value;

wherein the data value stored by the primary latch is unaffected by a value of the single retention mode pin and a logic level of the clock signal following the synchronizing edge.

9. The method as recited in claim 8, further comprising continuously writing the data value back to the secondary latch when the single retention mode pin is the second value, and disabling an output of the secondary latch when the single retention mode pin is the second value.

10. The method as recited in claim 8, wherein when the retention latch is in the pre-charge state, the retention latch does not respond to changes in the data value stored by the secondary latch.

11. The method as recited in claim 8, further comprising:
receiving, from the secondary latch, a first input on a gate of a first N-type transistor of the retention latch;
receiving, from the secondary latch, a second input on a gate of a second N-type transistor of the retention latch.

12. The method as recited in claim 11, wherein a node of the retention latch is coupled to a gate of a third N-type transistor of the secondary latch.

13. The method as recited in claim 12, wherein a drain of the third N-type transistor is coupled to a pre-buffered data output.

14. The method as recited in claim 13, wherein a signal from the single retention mode pin is coupled to a gate of a fourth N-type transistor, wherein the method further comprising activating, by the fourth N-type transistor, the first and second N-type transistors when the signal from the single retention mode pin is the first value.

15. A system comprising:
a secondary latch coupled to receive a value from a primary latch, wherein the primary latch is configured to latch a data value present on an input port responsive to detecting a synchronizing edge of a clock signal; and
a retention latch coupled to the secondary latch, wherein the retention latch is configured to:
remain in a pre-charge state when a single retention mode pin is a first value; and
receive and store a data value of the secondary latch when the single retention mode pin transitions from the first value to a second value;
wherein the data value stored by the primary latch is unaffected by a value of the single retention mode pin and a logic level of the clock signal following the synchronizing edge.

16. The system as recited in claim 15, wherein the retention latch is configured to continuously write the data value back to the secondary latch when the single retention mode pin is the second value, and wherein an output of the secondary latch is disabled when the single retention mode pin is the second value.

17. The system as recited in claim 15, wherein when the retention latch is in the pre-charge state, the retention latch does not respond to changes in the data value stored by the secondary latch.

18. The system as recited in claim 15, wherein a first input received by the retention latch from the secondary latch is coupled to a gate of a first N-type transistor, and wherein a second input received by the retention latch from the secondary latch is coupled to a gate of a second N-type transistor.

19. The system as recited in claim 18, wherein a node of the retention latch is coupled to a gate of a third N-type transistor.

20. The system as recited in claim 19, wherein a drain of the third N-type transistor is coupled to a pre-buffered data output.

* * * * *